United States Patent
Lee

(10) Patent No.: US 7,504,922 B2
(45) Date of Patent: Mar. 17, 2009

(54) EMBEDDED INDUCTOR ELEMENT AND CHIP PACKAGE APPLYING THE SAME

(75) Inventor: Sheng-Yuan Lee, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 11/439,477

(22) Filed: May 22, 2006

(65) Prior Publication Data

US 2007/0090911 A1     Apr. 26, 2007

(30) Foreign Application Priority Data

Oct. 24, 2005     (TW) .............................. 94137096 A

(51) Int. Cl.
 *H01F 5/00* (2006.01)

(52) U.S. Cl. ..................................... 336/200

(58) Field of Classification Search .................. 336/65, 336/83, 178, 200, 232, 206–208; 257/531
See application file for complete search history.

(56) References Cited

U.S. PATENT DOCUMENTS

| 6,922,557 | B2* | 7/2005 | Fantaske ...................... 455/403 |
| 7,319,377 | B2* | 1/2008 | Lee et al. ..................... 336/200 |
| 2001/0016409 | A1* | 8/2001 | Farrar et al. .................. 438/619 |
| 2001/0024153 | A1* | 9/2001 | Farrar et al. .................. 336/200 |
| 2001/0028098 | A1* | 10/2001 | Liou ........................... 257/531 |

* cited by examiner

*Primary Examiner*—Tuyen T. Nguyen
(74) *Attorney, Agent, or Firm*—J.C. Patents

(57) ABSTRACT

An embedded inductor suitable for a wiring board is provided. The wiring board comprises a plurality of patterned conductive layers, at least an insulating layer, and a plurality of conductive vias. The insulating layer is disposed between the neighboring patterned conductive layers. Two of the patterned conductive layers are electrically connected to each other through one of the conductive vias. The embedded inductor comprises a conductive spiral structure and at least an insulating portion. The insulating portion is disposed in the insulating layer and adjacent to the conductive spiral structure. The dielectric constant of the insulating portion is lower than that of the insulating layer. A parasitic capacitance value generated from the operation of the embedded inductor of the present invention is lower. Accordingly, the resonant frequency and the quality factor of the embedded inductor are effectively improved.

10 Claims, 7 Drawing Sheets

EMBEDDED INDUCTOR ELEMENT AND CHIP PACKAGE APPLYING THE SAME

CROSS-REFERENCE TO RELATED APPLICATION

This application claims the priority benefit of Taiwan application serial no. 94137096, filed on Oct. 24, 2005. All disclosure of the Taiwan application is incorporated herein by reference.

BACKGROUND OF THE INVENTION

1. Field of the Invention

The present invention relates to an embedded inductor, and more particularly, to a package applying this embedded inductor.

2. Description of the Related Art

In general, the conventional wiring board for hosting and electrically connecting a plurality of electronic devices is mainly composed of a plurality of patterned conductive layers and a plurality of insulating layers that are disposed alternately with each other. The patterned conductive layers may be formed by performing a patterning process on the copper foil, and the insulating layers are disposed between the neighboring patterned conductive layers in order to insulate the patterned conductive layers from each other. In addition, the interleaved conductive layers are electrically connected with each other through the conductive vias passing through the insulating layers. Moreover, various electronic devices (for example, active or passive devices) may be further The passive device mentioned above may be a capacitor, a resistor, or an inductor. Such types of passive device can be disposed on the surface of the wiring board by the Surface Mount Technology (SMT). In addition, the passive device also can be embedded in the wiring board in order to increase the layout area of the wiring board. Please refer to FIGS. 1A and 1B for the details of the embedded inductor. FIG. 1A is a perspective view of a conventional embedded inductor suitable for a wiring board, and FIG. 1B is a cross sectional view along line A-A in FIG. 1A. The conventional embedded inductor 100 is suitable for a wiring board 10. The wiring board 10 comprises four patterned conductive layers 12, three insulating layers 14, and a plurality of conductive vias 16 (only one conductive via is shown in FIG. 1B). A top patterned conductive layer 12a forms a conductive spiral structure 110 of the embedded inductor 100, and a conductive line 112 of the conductive spiral structure 110 forms a spiral pattern. Moreover, one end of the conductive line 112 is electrically connected to a bottom patterned conductive layer 12d through a conductive via 16. Furthermore, the patterned conductive layers 12b and 12c are used as a power plane and a ground plane, respectively.

However, a parasitic capacitance effect will occur during operating the conventional embedded inductor, which decreases the self-resonance frequency of the embedded inductor. Moreover, the quality factor Q of the embedded inductor is further degraded due to the dielectric loss of the insulating layers in the wiring board. Accordingly, how to reduce the parasitic capacitance value of the conventional embedded inductor becomes a major issue in the field.

SUMMARY OF THE INVENTION

The present invention provides an embedded inductor suitable for a wiring board. The wiring board comprises a plurality of patterned conductive layers, at least an insulating layer, and a plurality of conductive vias. The insulating layer is disposed between the neighboring patterned conductive layers. Two of the patterned conductive layers are electrically connected to each other through one of the conductive vias. In addition, the embedded inductor comprises a conductive spiral structure and at least an insulating portion. The insulating portion is disposed in the insulating layer and adjacent to the conductive spiral structure.

The present invention further provides a package for a solid-state device. The package comprises a package substrate, a solid-state device, and at least an embedded inductor. The package substrate comprises a plurality of patterned conductive layers, at least an insulating layer, and a plurality of conductive vias. The insulating layer is disposed between the neighboring patterned conductive layers. Two of the patterned conductive layers are electrically connected to each other through at least one of the conductive vias. Moreover, the solid-state device is disposed on the package substrate and electrically connected to the package substrate. Furthermore, the embedded inductor comprises a conductive spiral structure and at least an insulating portion. The insulating portion is disposed in the insulating layer and adjacent to the conductive spiral structure.

BRIEF DESCRIPTION DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION PREFERRED EMBODIMENTS

Before describing the present invention with embodiments, it is to be notified that in order to clearly display the structure and relative position of the present invention, the power plane and the ground plane of the wiring board are not shown in the accompanying drawings of the embodiments.

First Embodiment

Figure 1A:
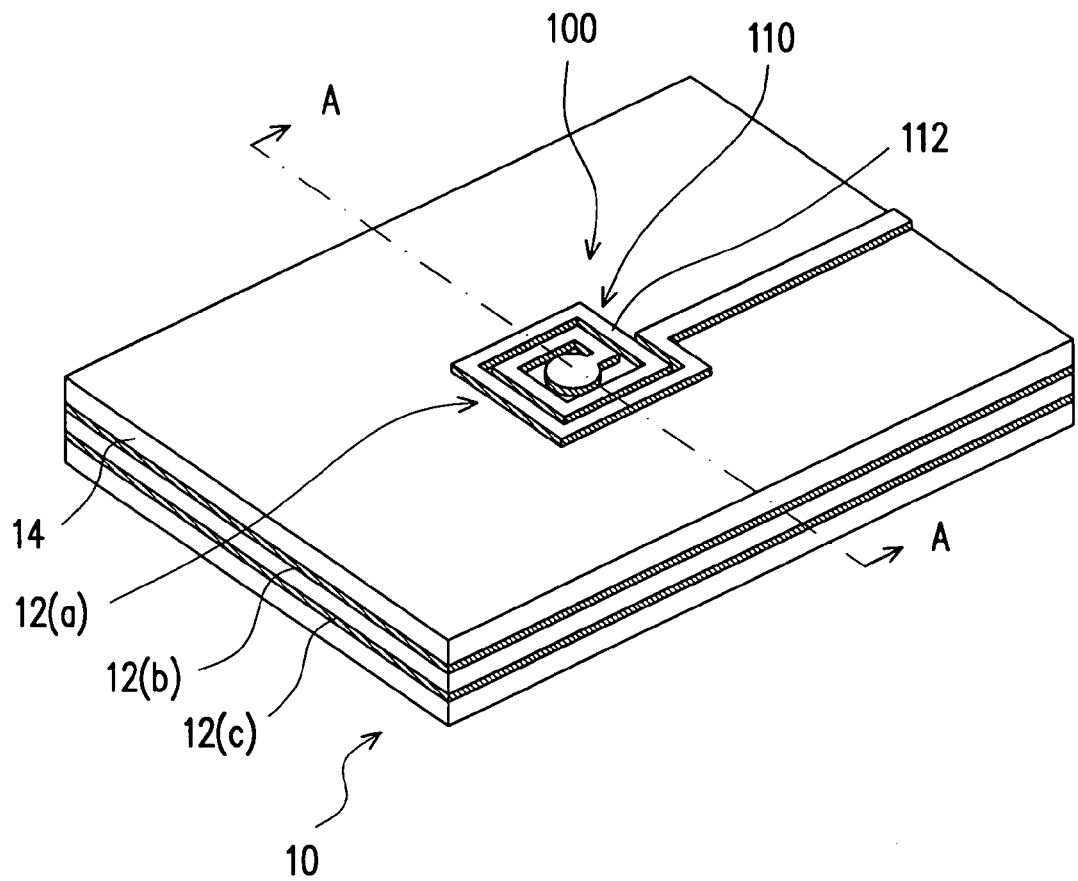
FIG. 1A is a perspective view of a conventional embedded inductor suitable for a wiring board.
Figure 1B:
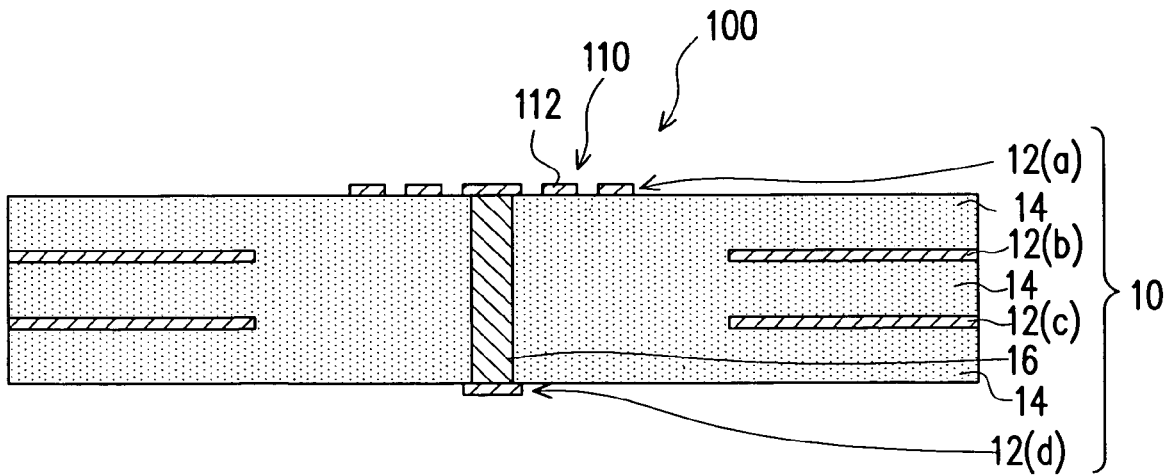
FIG. 1B is a cross sectional view along line A-A in FIG. 1A.
Figure 2A:
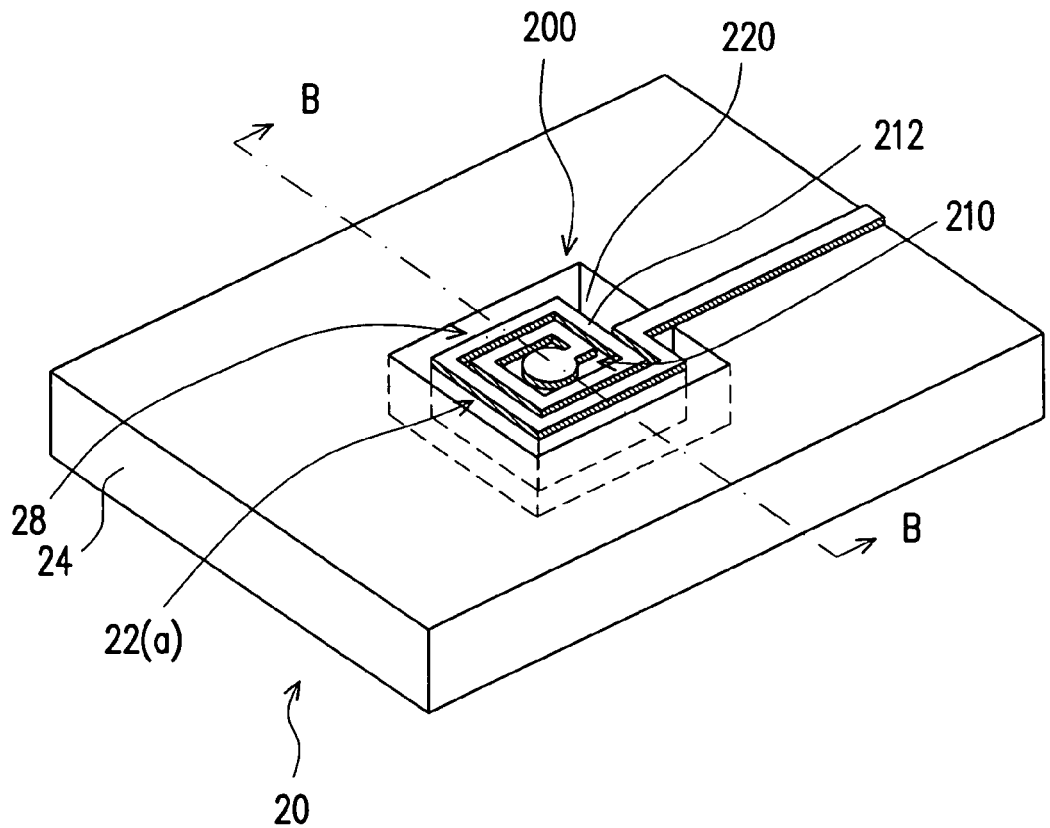
FIG. 2A is a perspective view of an embedded inductor according to a first embodiment of the present invention applied in the wiring board.
Figure 2B:
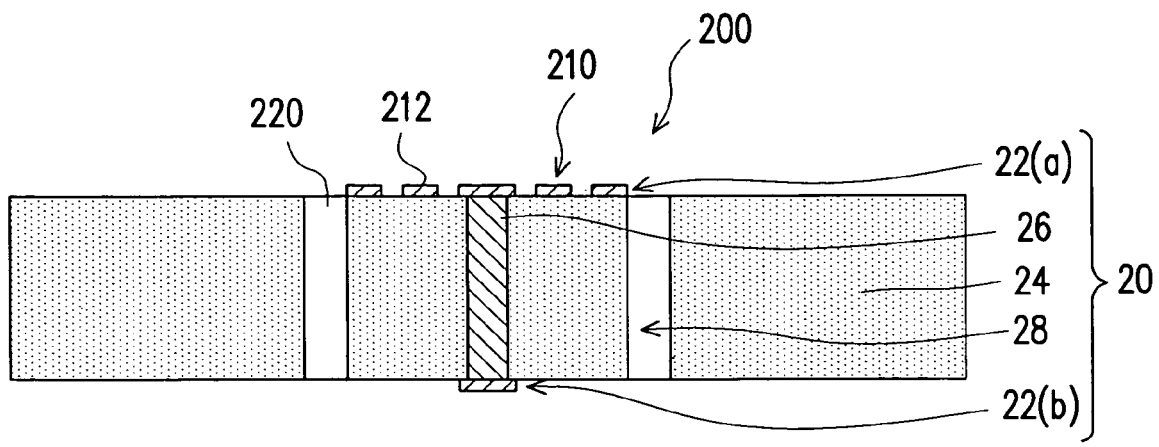
FIG. 2B is a cross sectional view along line B-B in FIG. 2A.

FIG. 2A is a perspective view of an embedded inductor applied in the wiring board according to a first embodiment of the present invention, and FIG. 2B is a cross sectional view along line B-B in FIG. 2A. Referring to FIGS. 2A and 2B, the embedded inductor 200 of the first embodiment is suitable for a wiring board 20. The wiring board 20, for example may be a package substrate or a circuit board, comprises a plurality of patterned conductive layers 22 (e.g. two layers are shown in FIG. 2B), at least an insulating layer 24 (e.g. one layer is shown in FIG. 2B), and a plurality of conductive vias 26 (e.g. one via is shown in FIG. 2B). Two neighboring patterned conductive layers 22 are insulated by an insulating layer 24 disposed between them, and two of the patterned conductive layers 22 would be electrically connected with each other through one of the conductive vias 26. In addition, the patterned conductive layers 22 may be formed by patterning the copper foil. The insulating layer 24 may be made of FR-4 or epoxy resin, and the conductive vias 26 may be made of copper.

Referring to FIGS. 2A and 2B, the embedded inductor 200 comprises a conductive spiral structure 210 and at least an insulating portion 220 (e.g. one is shown in FIG. 2A). The insulating portion 220 may be formed by drilling or etching the insulating layer 24. The insulating portion 220 neighboring to the conductive spiral structure 210 is disposed in the insulating layer 24. The dielectric constant of the insulating portion 220 is lower than that of the insulating layer 24, and the dielectric loss tangent of the insulating portion 220 is lower than the dielectric loss tangent of the insulating layer 24. Accordingly, the insulating portion 220 can reduce the parasitic capacitance generated by the embedded inductor 200 during the operation. In addition, in the first embodiment, the dielectric loss tangent of the insulating portion 220 is lower than that of the insulating layer 24, such that the quality factor Q is improved.

The conductive spiral structure 210 comprises at least a conductive line 212 (e.g. one line is shown in FIG. 2A), and the conductive line 212 is formed by one of the patterned conductive layers 22. As shown in FIGS. 2A and 2B, in the present embodiment, the conductive line 212 is formed as a spiral pattern of two circles by the top patterned conductive layer 22a. In addition, one end of the conductive line 212 is electrically connected to the bottom conductive layer 22b through the conductive via 26, and the other end of the conductive line 212 is horizontally extended. It is to be noted that although the spiral pattern formed by the conductive line 212 in the present embodiment is in the form of a square spiral, it can also be a spiral in the form of a circle. Although two circles are illustrated in this embodiment, more than two circles can be formed. In other words, the spiral shape and number of circles can be designed for different requirements.

Furthermore, in the present embodiment, the insulating portion 220 is disposed on the periphery of the conductive spiral structure 210. As shown in FIGS. 2A and 2B, in order to dispose the insulating portion 220 on the periphery of the conductive spiral structure 210, the wiring board 20 may further comprise at least a slot 28 (e.g. one slot is shown in FIG. 2A), and the insulating portion 220 is disposed inside the slot 28, such that the shape of the insulating portion 220 is matched with the slot 28. Moreover, the insulating portion 220 may be made of air or other material which having a low dielectric constant or a low dielectric loss tangent. It is to be noted that under the condition of not impacting the function of the insulating portion 220, in order to dispose the second insulating area 220 on the periphery of the conductive spiral structure 210, the wiring board 20 may comprise a plurality of holes (where the quantity of holes is determined by the design requirement) or may comprise a combination of at least a hole and a slot 28, and such cases are not shown in the accompanying diagram. Moreover, the formation of the slot 28 (or the holes) and the insulating portion 220 may be integrated into the fabricating process of the wiring board 20. In such case, a mechanical drilling process is used to form the slot 28 (or the hole), and further to form the insulating portion 220 inside the slot 28 (or the hole).

Second Embodiment

Figure 3A:
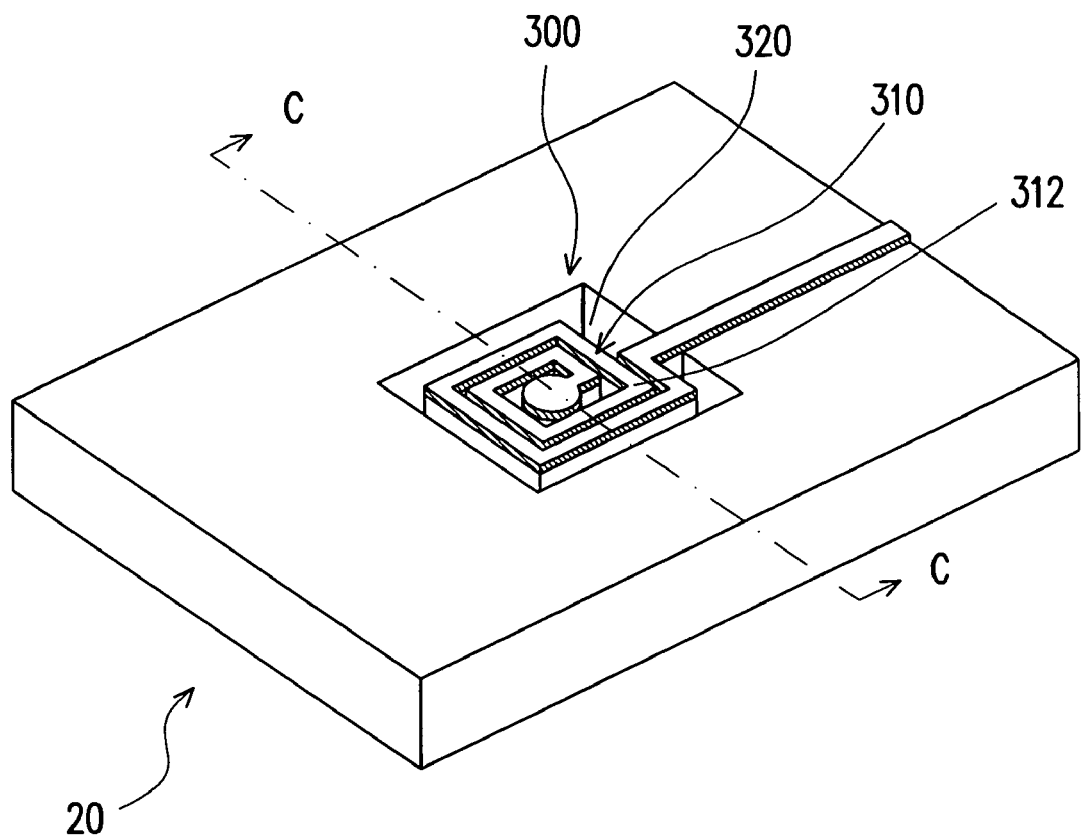
FIG. 3A is a perspective view of an embedded inductor according to a second embodiment of the present invention applied in the wiring board.
Figure 3B:
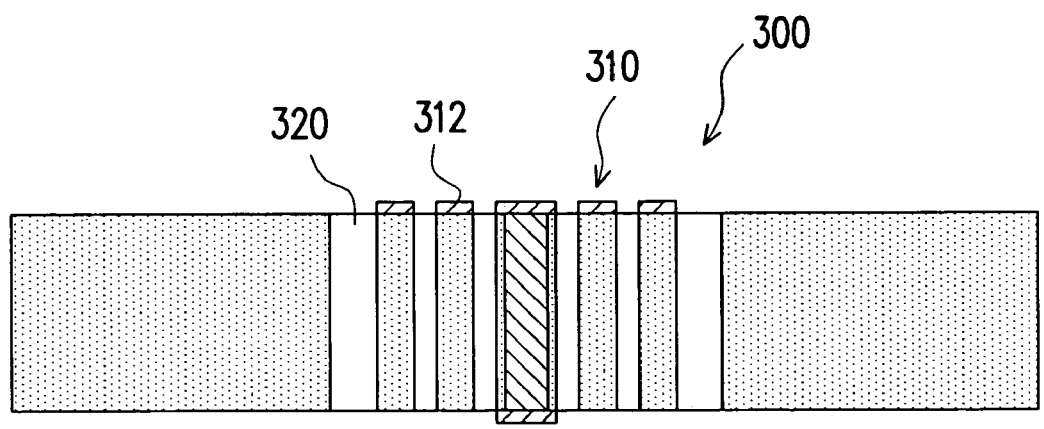
FIG. 3B is a cross sectional view along line C-C in FIG. 3A.

FIG. 3A is a perspective view of an embedded inductor according to a second embodiment of the present invention applied in the wiring board, and FIG. 3B is a cross sectional view along line C-C in FIG. 3A. Referring to FIGS. 3A and 3B, comparing with the embedded inductor 200 of the first embodiment, the insulating portion 320 of the embedded inductor 300 in the second embodiment is disposed both on the periphery and the internal area of the conductive spiral structure 310. In other words, the insulating portion 320 is extended spirally to the internal area of the conductive spiral structure 310 formed the peripheral area of the conductive spiral structure 310 along with the conductive line 312 on the conductive spiral structure 310. Accordingly, comparing with the first embodiment, the insulating portion 320 of the embedded inductor 300 in the second embodiment has a wider range, thus it can reduce more parasitic capacitance.

It is to be noted that the distribution of the insulating portion 320 may be changed for different design requirements. For example, the insulating portion 320 may be only disposed inside the conductive spiral structure 310, and such case is not shown in the accompanying drawing.

Third Embodiment

Figure 4A:
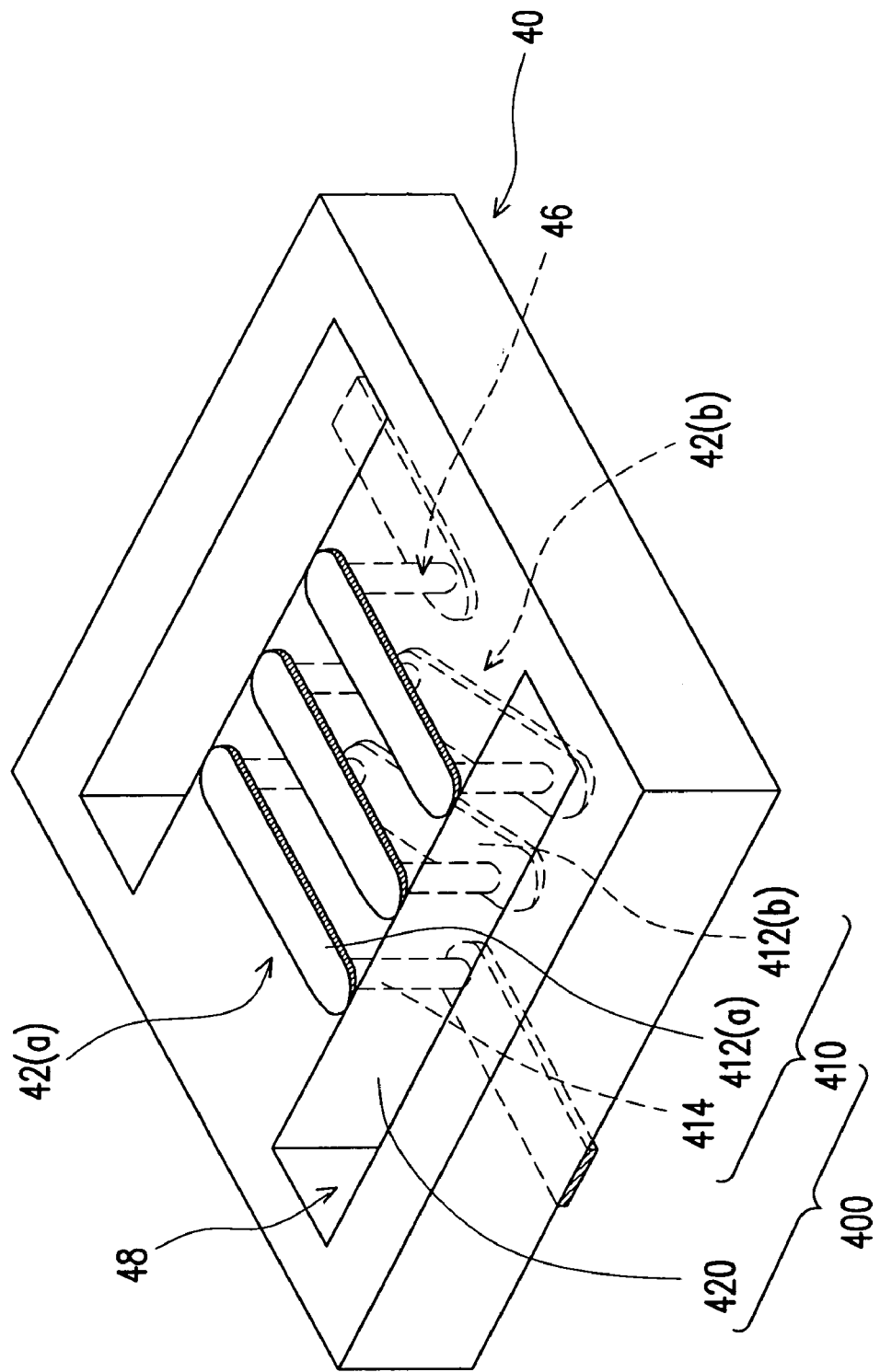
FIG. 4A is a perspective view of an embedded inductor according to a third embodiment of the present invention applied in the wiring board.

FIG. 4A is a perspective view of an embedded inductor according to a third embodiment of the present invention applied in the wiring board. Referring to FIG. 4A, the embedded inductor 400 of the present embodiment comprises a conductive spiral structure 410 and at least an insulating portion 420 (e.g. two are shown in FIG. 4A). In the third embodiment, the conductive spiral structure 410 comprises live conductive lines 412, wherein three conductive lines 412a are formed by the top patterned conductive layer 42a, and the other two conductive lines 412b are formed by the bottom patterned conductive layer 42b. It is to be noted that the quantity and distribution of the conductive lines 412 may be changed for different design requirements.

In the third embodiment, the conductive spiral structure 410 further comprises at least a conductive line connection part 414 (e.g. six connection parts ale shown in FIG. 4A). These conductive line connection parts 414 are part of the conductive vias 46 in terms of quantity. In addition, the conductive lines 412a and the conductive lines 412b are electrically connected with each other through the conductive line connection parts 414 to form a spiral pattern. It is to be noted that the quantity and distribution of the conductive line connection parts 414 may be changed in accordance with the change of the quantity and distribution of the conductive lines 412 mentioned above. Accordingly, comparing to the first and second embodiments, the conductive spiral structure 410 of the embedded inductor 400 in the third embodiment comprises the conductive lines 412 and the conductive line connection parts 414.

As shown in FIG. 4A, in order to dispose the insulating portion 420 on the periphery of the conductive spiral structure 410, the insulating portion 420 must be disposed inside the slots 48 (e.g. two slots are shown in FIG. 4A) on the wiring board 40, such that the shape of the insulating portion 420 is matched to the slots 48.

Figure 4B:
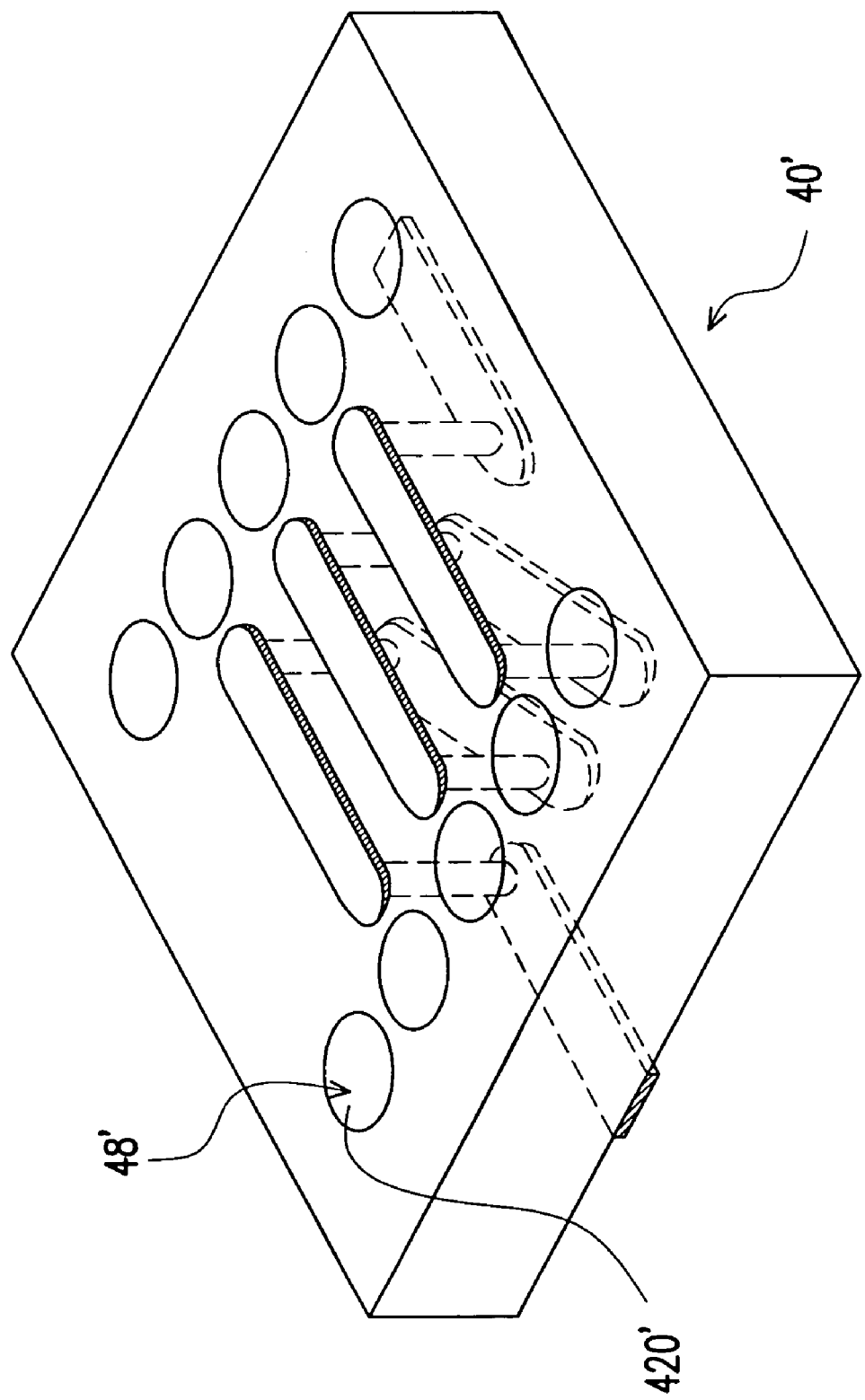
FIG. 4B is a perspective view showing the second insulating area of FIG. 4A in a hole of the wiring board.

However, the shape of the insulating portion 420 may be changed according to different options in the fabricating process. FIG. 4B is a perspective view showing the insulating portion of FIG. 4A in the holes of the wiring board. Referring to FIG. 4B, the insulating portion 420' may be disposed inside a plurality of holes 48' (e.g. ten holes are shown in FIG. 4B) on the wiring board 40', such that the shape of the insulating portion 420' is matched to the holes 48'. Since the position, function, material, and formation of the insulating portions 420 and 420' are the same as that in the first and second embodiments, its detail is omitted herein.

Fourth Embodiment

Figure 5A:
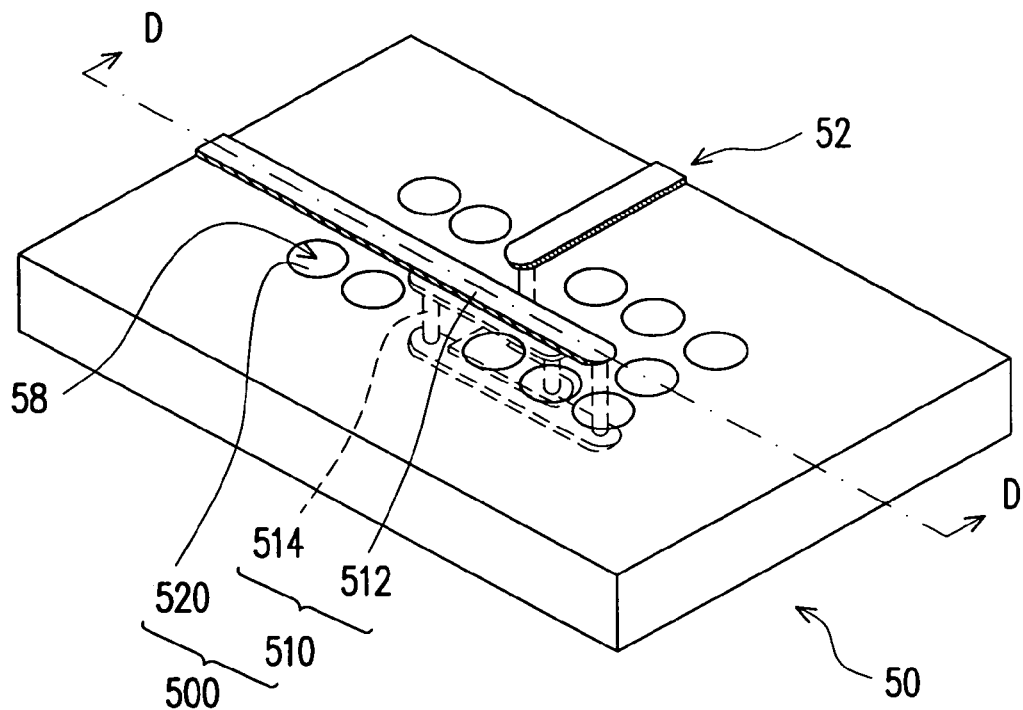
FIG. 5A is a perspective view of an embedded inductor according to a fourth embodiment of the present invention applied in the wiring board.
Figure 5B:
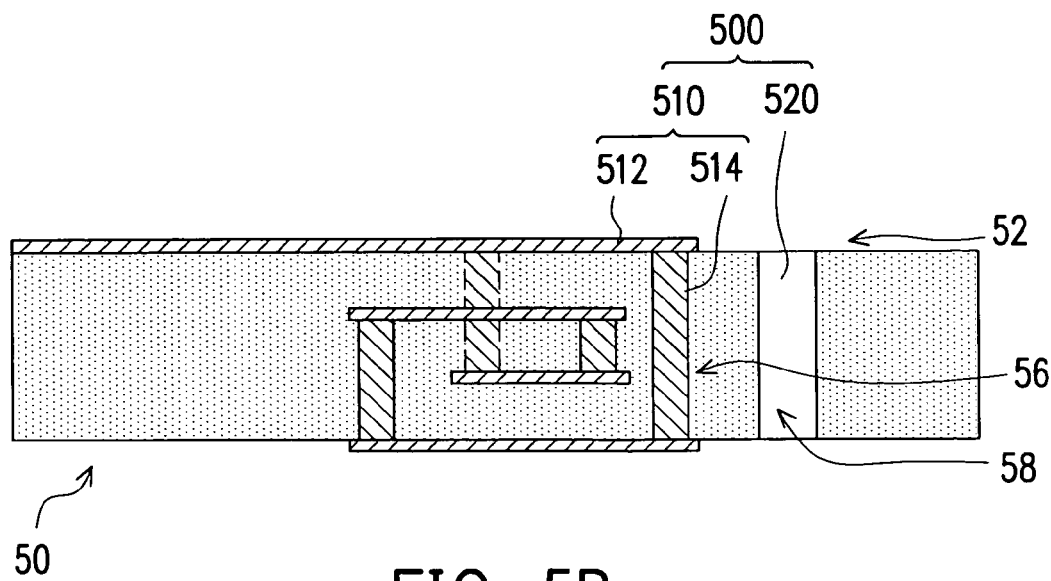
FIG. 5B is a cross sectional view along line D-D in FIG. 5A.

FIG. 5A is a perspective view of an embedded inductor applied in the wiring board according to a fourth embodiment of the present invention, and FIG. 5B is a cross sectional view along line D-D in FIG. 5A. Referring to FIGS. 5A aid 5B, the embedded inductor 500 of the fourth embodiment comprises a conductive spiral structure 510 aid at least an insulating portion 520 (e.g. 12 areas are shown in FIG. 5A). In the fourth embodiment, the conductive spiral structure 510 comprises fourth conductive lines 512 that are formed by four patterned conductive layers 54, respectively. It is to be noted that the quantity and distribution of the conductive lines 512 may be changed for different design requirements. In addition, as shown in FIG. 5A, the insulating portions 520 are disposed inside the holes 58 (e.g. 11 holes are shown in FIG. 5A) on the wiring, board 50, such that the shape of the insulating portion 520 is matched to the holes 58.

Similar to the conductive spiral structure 410 in FIG. 4A, the conductive spiral structure 510 in FIG. 5A further comprises at least a conductive line connection part 514 (e.g. four connection parts are shown in FIG. 5B), the conductive line connection parts 514 are part of the conductive vias 56 in terms of quantity. In addition, the conductive lines 512 are electrically connected with each other through the conductive line connection parts 514 respectively to form a spiral pattern. It is to be noted that the quantity and distribution of the conductive line connection parts 514 may be changed in accordance with the change of the quantity and distribution of the conductive lines 512 mentioned above. Accordingly, comparing to the third embodiment, the conducive spiral structure 510 of the embedded inductor 500 in the fourth embodiment is disposed neighboring to the cross sectional view of line D-D shown in FIG. 5A referring to FIG. 5B). Since the function, material, and formation of the insulating portion 520 are the same as that in the first embodiment, its detail is omitted herein.

Figure 6A:
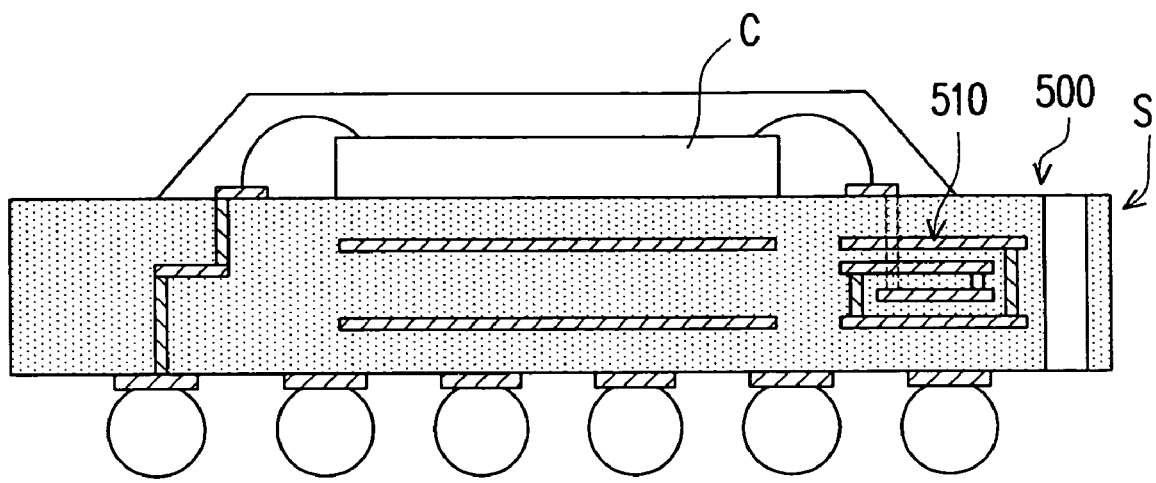
FIG. 6A is a cross sectional view of the embedded inductor according to the fourth embodiment of the present invention applied in a package.
Figure 6B:
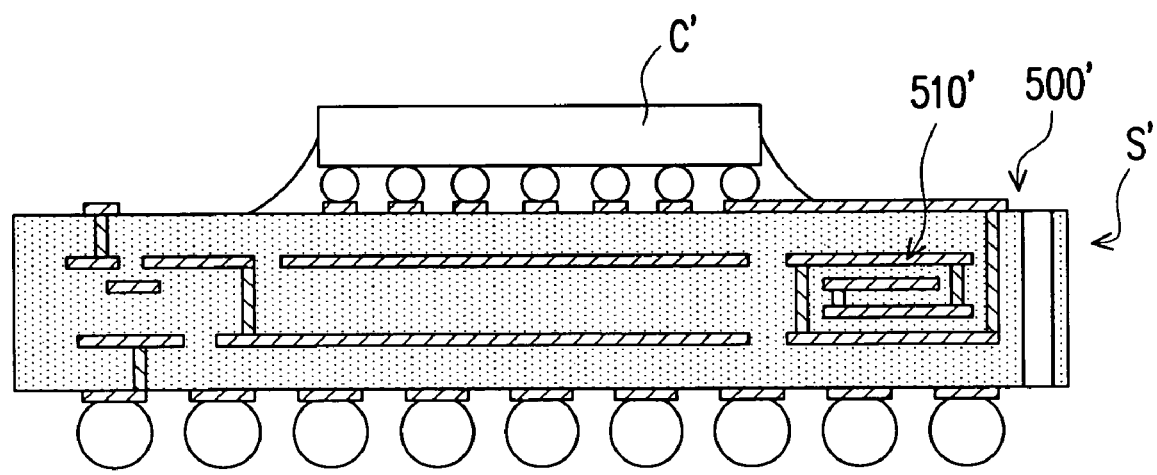
FIG. 6B is a cross sectional view of the embedded inductor according to the fourth embodiment of the present invention applied in another solid-state device package.

Finally, referring to FIGS. 6A and 6B, which schematically show the cross sectional views of all embedded inductor according to the fourth embodiment of the present invention applied in solid-state device packages, respectively. Referring to FIG. 6A, the package CP comprises a package substrate S, a solid-state device C, and at least an embedded inductor 500. The structure of the package substrate S is the same as that of the wiring board 20 described in the first embodiment (referring to FIG. 2B), thus its detail is omitted herein. The solid-state device C is disposed on the package substrate S, and the solid-state device C is electrically connected to the package substrate S by a wire bonding technology. In addition, referring to FIG. 6B, the difference between the package CP' and the package CP mentioned above is that the structure to form the conductive spiral structure 510' of the embedded inductor 500' is different form that to from the conductive spiral structure 510 in the embedded inductor 500 (referring to FIG. 6A), and the solid-state device C' is electrically connected to the package substrate S' by a flip chip bonding technology.

In summary, the embedded inductor of the present invention at least has the following advantages:

1. Since the insulating portion of the embedded inductor is neighboring to the conductive spiral structure in the present invention, the embedded inductor of the present invention has lower dielectric loss tangent and the parasitic capacitance generated by the embedded inductor during the operation is decreased, such that the resonant frequency and the quality factor Q of the embedded inductor are improved.

2. Since the embedded inductor of the present invention has higher resonant frequency, the applicable frequency range of the embedded inductor provided by the present invention is also improved; thus, it can be further applied in the radio frequency (RF) circuit.

3. Since the formation of the insulating portion of the embedded inductor provided by the present invention can be integrated into the fabricating process of the circuit board or the package substrate, the present invention does not increase any cost of the fabricating equipment.

Although the invention has been described with reference to a particular embodiment thereof, it will be apparent to one of the ordinary skills in the art that modifications to the described embodiment may be made without departing from the spirit of the invention. Accordingly, the scope of the invention will be defined by the attached claims not by the above detailed description.

What is claimed is:

1. An embedded inductor suitable for a wiring board, the wiring board comprising a plurality of patterned conductive layers, at least an insulating layer, and a plurality of conductive vias, wherein the insulating layer is disposed between the neighboring patterned conductive layers, two of the patterned conductive layers are electrically coupled to each other through one of the conductive vias, and the embedded inductor comprises:

a conductive spiral structure; and
   at least an insulating portion disposed in the insulating layer, wherein the insulating portion is neighboring to the conductive spiral structure and vertically throughout the whole layers of the wiring board including the patterned conductive layers and the insulating layer.

2. The embedded inductor of claim 1, wherein the conductive spiral structure comprises at least a conductive line, and the conductive line is formed by one of the patterned conductive layers.

3. The embedded inductor of claim 1, wherein the insulating portion is disposed on the periphery of the conductive spiral structure.

4. The embedded inductor of claim 1, wherein the insulating portion is disposed inside the conductive spiral structure.

5. The embedded inductor of claim 1, wherein the insulating portion is disposed in at least a hole on the wiring board.

6. The embedded inductor of claim 1, wherein the insulating portion is disposed in at least a slot on the wiring board.

7. The embedded inductor of claim 1, wherein the material of the insulating portion includes air.

8. The embedded inductor of claim 1, wherein the dielectric loss tangent of the insulating portion is lower than the dielectric loss tangent of the insulating layer.

9. The embedded inductor of claim 1, wherein the dielectric constant of the insulating portion is lower than the dielectric constant of the insulating layer.

10. The embedded inductor of claim 1, wherein the insulating portion is formed by drilling or etching the insulating layer.

* * * * *